(12) United States Patent
Xie et al.

(10) Patent No.: US 12,252,779 B2
(45) Date of Patent: Mar. 18, 2025

(54) METHODS FOR IN-SITU CHAMBER MONITORING

(71) Applicant: Applied Materials, Inc., Santa Clara, CA (US)

(72) Inventors: Xiangjin Xie, Fremont, CA (US); Carmen Leal Cervantes, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 20 days.

(21) Appl. No.: 17/109,661

(22) Filed: Dec. 2, 2020

(65) Prior Publication Data

US 2021/0164093 A1 Jun. 3, 2021

Related U.S. Application Data

(60) Provisional application No. 62/942,717, filed on Dec. 2, 2019.

(51) Int. Cl.
| | |
|---|---|
| C23C 14/54 | (2006.01) |
| C23C 14/00 | (2006.01) |
| C23C 14/02 | (2006.01) |
| C23C 14/08 | (2006.01) |
| C23C 14/52 | (2006.01) |
| H01L 21/02 | (2006.01) |

(52) U.S. Cl.
CPC ........ *C23C 14/547* (2013.01); *C23C 14/0036* (2013.01); *C23C 14/025* (2013.01); *C23C 14/087* (2013.01); *C23C 14/52* (2013.01); *H01L 21/02252* (2013.01)

(58) Field of Classification Search
None
See application file for complete search history.

(56) References Cited

U.S. PATENT DOCUMENTS

| | | | |
|---|---|---|---|
| 8,293,597 B2 | 10/2012 | Raaijmakers | |
| 2005/0208754 A1 | 9/2005 | Kostamo et al. | |
| 2014/0159239 A1* | 6/2014 | Bossler | H01L 23/53238 438/694 |
| 2016/0111342 A1* | 4/2016 | Huang | H01L 21/02252 156/345.24 |

FOREIGN PATENT DOCUMENTS

| | | | | |
|---|---|---|---|---|
| EP | 1143222 A1 * | 10/2001 | | G01B 11/06 |
| JP | 2002062155 A | 2/2002 | | |
| JP | 2018078292 A | 5/2018 | | |
| KR | 20120059853 A | 6/2012 | | |

OTHER PUBLICATIONS

PCT International Search Report and Written Opinion in PCT/US2020/062812 dated Mar. 26, 2021, 11 pages.

* cited by examiner

*Primary Examiner* — Michael G Miller
(74) *Attorney, Agent, or Firm* — Servilla Whitney LLC

(57) ABSTRACT

Methods for monitoring process chambers using a controllable plasma oxidation process followed by a controlled reduction process and metrology are described. In some embodiments, the metrology comprises measuring the reflectivity of the metal oxide film formed by the controllable plasma oxidation process and the reduced metal film or surface modified film formed by reducing the metal oxide film.

15 Claims, No Drawings

METHODS FOR IN-SITU CHAMBER MONITORING

CROSS-REFERENCE TO RELATED APPLICATIONS

This application claims priority to U.S. Provisional Application No. 62/942,717, filed Dec. 2, 2019, the entire disclosure of which is hereby incorporated by reference herein.

TECHNICAL FIELD

Embodiments of the present disclosure generally relate to methods for monitoring a process chamber. In particular, embodiments of the disclosure provide methods for monitoring the maintenance requirements and system integrity of a process chamber.

BACKGROUND

One or more of the back-end-of-line (BEOL) processes employ preclean chambers. The preclean chambers are generally qualified prior to use. Traditionally, qualification involved forming an ex-situ metal oxide film formed as a native metal oxide plus furnace anneal. The process causes both within wafer and between wafer variations. Also, the wafer is re-exposed to air after reduction. Post measurement processes are only able to determine bulk film reduction. The process is not sensitive enough to evaluate if there is a chamber or system leak.

Therefore, there is a need for methods of monitoring and qualifying process chambers that allows for system integrity evaluation.

SUMMARY

One or more embodiments of the disclosure are directed to methods for process chamber monitoring. A parameter of an oxide film formed on a substrate is measured. The oxide film on the substrate is reduced to a reduced metal film or surface modified film. A parameter of the reduced metal film is measured and the amount of oxide film removed from the substrate is determined by comparing the parameter of the oxide film with the parameter of the reduced metal film.

Additional embodiments of the disclosure are directed to methods of monitoring a process chamber. A reference thickness of a metal oxide film formed by a reference method on a substrate surface is determined. A sample thickness of a metal oxide film formed by the reference method in the process chamber is measured and compared with the reference thickness.

Further embodiments of the disclosure are directed to methods of monitoring a process chamber comprising determining a reference reduced metal film thickness form by a reference method. The reference method comprising forming a metal film on the substrate, forming an oxide film from the metal film with an $H_2O$ plasma and reducing the oxide film to form a reduced metal film. A sample reduced metal film thickness prepared by the reference method is measured and compared to the reference thickness.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure address oxide film preparation issues and/or simplify the preclean chamber qualification process. Some embodiments shorten the time requirement for preclean chamber qualification. Some embodiments combine an optical bench module (e.g., ellipsometry) in an integrated solution for one or more of preclean chamber performance monitoring or trouble shooting the chamber or evaluating for system leaks.

Some embodiments of the disclosure provide uniform and controllable metal oxide growth solutions. Combined with in-situ measurement, some embodiments form an integrated solution for preclean performance monitoring reducing downtime.

One or more embodiments of the disclosure are directed to methods for process chamber monitoring. In a broad embodiment of the disclosure, a parameter of a metal oxide film formed on a substrate is measured. The oxide film is reduced to form a reduced metal film on the substrate and the parameter of the reduced metal film is measured. The measurements are compared to determine the amount of oxide film removed from the substrate. In some embodiments, the oxide film is reduced to form a surface modified film and the measured parameter is related to the surface modified film. In some embodiments, the oxide film is reduced to form a reduced metal film or a surface modified film and the parameter of the reduced metal film or surface modified film is measured.

Some embodiments include the full formation of the metal oxide film by first forming an oxide film on a substrate surface, depositing a metal film on the substrate surface and then oxidizing the metal film to form the oxide film. The oxide film can be formed by any suitable technique known to the skilled artisan. In some embodiments, the substrate comprises the oxide film. For example, in some embodiments, the substrate comprises a 1 kÅ thermal oxide wafer.

In some embodiments, a metal film is formed on the substrate prior to forming the oxide film so that the oxide film is generated from the metal film. The metal film can be formed from any suitable metal by any suitable technique known to the skilled artisan. In some embodiments, the metal film comprises one or more of copper (Cu), cobalt (Co), ruthenium (Ru), rhodium (Rh), iridium (Ir) or tungsten (W). In some embodiments, the metal film consists essentially of one or more of copper (Cu), cobalt (Co), ruthenium (Ru), rhodium (Rh), iridium (Ir) or tungsten (W). As used in this manner, the term "consists essentially of" means that the composition of metal atoms in the metal film is greater than or equal to about 95%, 98%, 99% or 99.5% of the stated metal(s) on an atomic basis.

The metal film can be deposited to any suitable thickness. In some embodiments, the metal film has a thickness in the range of about 200 Å to about 1500 Å, or in the range of about 300 Å to about 1200 Å, or in the range of about 400 Å to about 1000 Å.

In some embodiments, the metal film comprises or consists essentially of copper. In one or more embodiments, prior to forming the copper film, a tantalum film is formed on the substrate. The tantalum film can be formed by any suitable technique known to the skilled artisan. In some embodiments, the tantalum film is formed to a thickness in the range of about 20 Å to about 180 Å, or in the range of about 50 Å to about 150 Å. In some embodiments, the copper film is deposited at temperatures less than or equal to about 100 C, 80 C, 60 C, 50 C, 40 C, 30 C or room temperature (25 C).

In some embodiments, the metal film comprises or consists essentially of cobalt. In some embodiments, prior to forming the cobalt film, a tantalum nitride film is formed on the substrate. The tantalum nitride film can be formed by any suitable technique known to the skilled artisan. In some embodiments, the tantalum nitride film has a thickness in the range of about 20 Å to about 40 Å.

After forming the metal film, a parameter of the metal film is measured. In some embodiments, the parameter comprises the thickness of the metal film. The thickness of the metal film, according to one or more embodiments, is measured by reflectivity. In some embodiments, the reflectivity metal film is measured at 480 nm and compared to the reflectivity of a silicon substrate with native oxide at the same wavelength. A pure copper film should have a reflectivity about 145% of the reflectivity of the silicon substrate with native oxide. In some embodiments, the reflectivity of the copper film is stored as a baseline or reference thickness which can be used to monitor the condition of the process chamber over a period of time. The reference or baseline thickness in some embodiments is representative of a "golden" chamber or, pristine reference chamber, which produces results that meet the predetermined criteria. In some embodiments, the changes in thickness over time is used to determine whether service or preventative maintenance is needed.

After formation of the metal film, the oxide film is formed on the substrate by oxidizing the metal film. In some embodiments, the metal film is oxidized using a controllable oxidation process. In some embodiments, the metal oxide film is formed by a water vapor ($H_2O$) remote plasma. In some embodiments, a copper oxide film is formed at a temperature less than or equal to about 375 C, or in the range of about 300 C to about 450 C, or in the range of about 325 C to about 400 C. In some embodiments, a cobalt oxide film is formed at a temperature in the range of about 200 C to about 300 C, or in the range of about 225 C to about 275 C.

In some embodiments, a parameter of the metal oxide film is measured. In some embodiments, the parameter measured is the thickness of the metal oxide film. In some embodiments, the thickness is measured by reflectivity. The reflectivity of the metal oxide film in some embodiments is used as a reference thickness to provide a standard by which the maintenance requirements of the chamber can be monitored.

After formation of the metal oxide film and measurement of the parameter(s) of interest, the metal oxide film is removed. In some embodiments, the formation of the metal oxide film and the reduction to the reduced metal film occur within the same process chamber. In some embodiments, the metal oxide film is formed in a different chamber than the reduced metal film. In some embodiments, forming the oxide film and the reduced metal film occurs without an air break.

The metal oxide film can be reduced to the reduced metal film using any suitable technique known to the skilled artisan. In some embodiments, the metal oxide film is reduced by exposure to a remote plasma comprising hydrogen ($H_2$). After reducing the metal oxide film to the reduced metal film, a parameter of the reduced metal film is measured. In some embodiments, the parameter of the reduced metal film comprises the thickness of the reduced metal film. In some embodiments, the thickness of the reduced metal film is measured using reflectivity.

In some embodiments, reducing the metal oxide film forms a surface modified film on the substrate. As used in this manner, a surface modified film is a film which incorporates the metal rather than forming a distinct metal oxide film. In some embodiments, the surface modified film comprises an alloy of a first metal and the metal from the metal oxide.

In some embodiments, process chamber preventative maintenance is performed when the reflectivity of the reduced metal film at 480 nm is less than 145% of reflectivity of a silicon substrate with native oxide film at 480 nm. In some embodiments, process chamber preventative maintenance is performed when the reflectivity of the reduced metal film or surface modified film is less than 145% of the reflectivity of a silicon substrate with native oxide film within the wavelength range of 200 nm to 900 nm.

Some embodiments of the disclosure are directed to methods of monitoring a process chamber by comparing sample film thicknesses to reference film thicknesses. In some embodiments, when the sample film thicknesses diverges from the reference film thicknesses by a predetermined amount, the process chamber is subjected to preventative maintenance.

Some embodiments of the disclosure are directed to methods of monitoring a process chamber by determining a reference reduced metal film thickness formed by a reference method on a substrate and comparing a sample metal film thickness over time. The divergence of the sample metal film thickness from the reference metal film thickness indicates a chamber that has varied from the ideal conditions which generated the reference film thickness. In some embodiments, the reference method comprises forming a metal film on the substrate, forming an oxide film from the metal film with an $H_2O$ plasma, and reducing the oxide film to form the reduced metal film.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method for monitoring maintenance requirements of a preclean process chamber, the method comprising:
   forming a metal film on a substrate, followed by,
   forming an oxide film from the metal film with an $H_2O$ plasma in the preclean process chamber;
   measuring a thickness of the oxide film formed on the substrate by a reflectivity obtained from the oxide film;
   after forming the oxide film and measuring the thickness of the oxide film, reducing the oxide film to form a reduced metal film or surface modified film on the substrate, wherein forming the oxide film and reducing the oxide film to the reduced metal film occur within the same preclean process chamber and without an air break;
   measuring a thickness of the reduced metal film or surface modified film by a reflectivity obtained from the reduced metal film or surface modified film;
   determining an amount of oxide film removed from the substrate by comparing the thickness of the oxide film with the thickness of the reduced metal film or surface modified film; and
   determining whether preventative maintenance on the preclean process chamber is to be performed based on the amount of oxide film removed from the substrate obtained from a standard for the maintenance requirements determined by a reference thickness obtained from the reflectivity of the oxide film, and performing the preventative maintenance on the preclean process chamber when the reflectivity of the reduced metal film or surface modified film does not meet the standard.

2. The method of claim 1, wherein the metal film comprises one or more of copper (Cu), cobalt (Co), ruthenium (Ru), rhodium (Rh), iridium (Ir) or tungsten (W), and the method determines if there is a leak in the preclean process chamber.

3. The method of claim 1, wherein the metal film has a thickness in the range of about 200 Å to about 1500 Å.

4. The method of claim 3, wherein the metal film comprises a copper film deposited at a temperature of less than 100 C.

5. The method of claim 4, further comprising forming a tantalum film on the substrate prior to depositing the copper film, the copper film deposited directly on the tantalum film.

6. The method of claim 5, wherein the tantalum film has a thickness in the range of about 20 Å to about 180 Å.

7. The method of claim 6, wherein the substrate comprises a 1 kÅ thermal oxide wafer.

8. The method of claim 3, wherein the metal film comprises a cobalt film.

9. The method of claim 8, further comprising forming a tantalum nitride film on the substrate prior to depositing the cobalt film.

10. The method of claim 9, wherein the tantalum nitride film has a thickness in the range of about 20 Å to about 40 Å.

11. The method of claim 4, wherein the oxide film is formed at a temperature in a range of about 300 to about 450 C.

12. The method of claim 8, wherein the oxide film is formed at a temperature in a range of about 200 C to about 300 C.

13. The method of claim 1, further comprising performing the preventative maintenance on the preclean process chamber when the reflectivity of the reduced metal film at 480 nm is less than 145% of reflectivity of a silicon substrate with native oxide film at 480 nm.

14. The method of claim 1, wherein reducing the oxide film forms the surface modified film, the surface modified film comprising an alloy of a metal selected from one or more of copper (Cu), cobalt (Co), ruthenium (Ru), rhodium (Rh), iridium (Ir) or tungsten (W) and the metal from the oxide film.

15. The method of claim 1, further comprises in-situ ellipsometry for integrated monitoring and to check the preclean process chamber for leaks.

* * * * *